US009167711B2

(12) United States Patent
Lee

(10) Patent No.: US 9,167,711 B2
(45) Date of Patent: Oct. 20, 2015

(54) MOBILE APPARATUS

(71) Applicant: Seung-Won Lee, Yongin-si (KR)

(72) Inventor: Seung-Won Lee, Yongin-si (KR)

(73) Assignee: SAMSUNG ELECTRONICS CO., LTD., Suwon-Si (KR)

( * ) Notice: Subject to any disclaimer, the term of this patent is extended or adjusted under 35 U.S.C. 154(b) by 93 days.

(21) Appl. No.: 13/681,679

(22) Filed: Nov. 20, 2012

(65) Prior Publication Data

US 2013/0170126 A1    Jul. 4, 2013

(30) Foreign Application Priority Data

Jan. 3, 2012  (KR) .................. 10-2012-0000653
Jun. 26, 2012 (KR) .................. 10-2012-0068704

(51) Int. Cl.
*G06F 1/16* (2006.01)
*H05K 7/02* (2006.01)
*G06F 3/02* (2006.01)

(52) U.S. Cl.
CPC ............... *H05K 7/02* (2013.01); *G06F 1/1601* (2013.01); *G06F 1/1626* (2013.01); *G06F 1/1632* (2013.01); *G06F 1/1654* (2013.01); *G06F 1/1669* (2013.01); *G06F 1/1675* (2013.01); *G06F 1/1681* (2013.01); *G06F 3/0202* (2013.01)

(58) Field of Classification Search
CPC .......................................... G06F 1/16
USPC ........ 235/145 R, 375, 462.1; 455/566, 575.4, 455/41.1, 41.2, 406, 566.1; 345/169, 545, 345/173, 32, 520, 156, 660, 419, 158, 649, 345/661, 157, 204, 179; 200/5 A, 61.62; 361/679.17, 679.29, 679.21, 679.27, 361/679.06, 679.55, 679.07, 679.22, 361/679.15, 679.13, 679.09, 679.59, 361/679.56, 679.26, 679.08; 248/553, 248/220.22, 324, 176.1, 918, 917, 291.1, 248/278.1, 571, 274.1, 489
See application file for complete search history.

(56) References Cited

U.S. PATENT DOCUMENTS

| 6,937,468 | B2 | 8/2005 | Lin et al. | |
|---|---|---|---|---|
| 7,659,888 | B2* | 2/2010 | Kyouzuka et al. | 345/173 |
| 7,966,040 | B2 | 6/2011 | Kim et al. | |
| 2004/0209489 | A1 | 10/2004 | Clapper | |
| 2008/0024975 | A1* | 1/2008 | Huang et al. | 361/686 |
| 2011/0080326 | A1* | 4/2011 | Won et al. | 343/702 |
| 2011/0086681 | A1* | 4/2011 | Ladouceur et al. | 455/575.4 |
| 2012/0194448 | A1 | 8/2012 | Rothkopf | |
| 2013/0178155 | A1* | 7/2013 | Shulenberger | 455/41.1 |
| 2013/0178161 | A1* | 7/2013 | Shulenberger | 455/41.2 |
| 2013/0201646 | A1* | 8/2013 | Braun | 361/784 |
| 2014/0035511 | A1* | 2/2014 | Ferber et al. | 320/103 |

* cited by examiner

*Primary Examiner* — Hung Duong
(74) *Attorney, Agent, or Firm* — Staas & Halsey LLP

(57) ABSTRACT

A mobile apparatus includes a first body, a second body, a rotary adaptor including an accommodation portion to accommodate the second body, rotatably installed on the first body, and to move the second body to a position where the second body is stacked on the first body and a position where the second body is unfolded, first magnets disposed on the accommodation portion, and second magnets disposed on the second body so as to face the first magnets and having different polarity from the first magnets.

38 Claims, 12 Drawing Sheets

MOBILE APPARATUS

CROSS-REFERENCE TO RELATED APPLICATIONS

This application claims priority under 35 U.S.C. §119 from Korean Patent Application Nos. 10-2012-0000653 and 10-2012-0068704, filed on Jan. 3, 2012 and Jun. 26, 2012, respectively, in the Korean Intellectual Property Office, the disclosures of which are incorporated herein in their entirety by reference.

BACKGROUND OF THE INVENTION

1. Field of the Invention

The present general inventive concept relates to a mobile apparatus in which two bodies are detachably attached to each other.

2. Description of the Related Art

A mobile apparatus, that is, a portable mobile apparatus, such as a notebook computer, includes a display unit for transferring information via vision and a manipulation unit for manipulating the mobile apparatus. The display unit and the manipulation unit are installed on two bodies, respectively. By tilting the two bodies, the manipulation unit, the display unit, or both of them may be converted into a use state in that a user can use the mobile apparatus or a pause state for movement and accommodation of the mobile apparatus.

With regard to a notebook computer, two bodies are coupled to each other via a fixed-type hinge structure, and thus, the two bodies cannot be separated from each other. Recently, as usable tablet computers have become popular, it is necessary to provide a method of detaching or mounting a tablet computer from or on a body including a manipulation unit as an input function of the tablet computer.

SUMMARY OF THE INVENTION

The present general inventive concept provides a mobile apparatus that is used in various forms by connecting two detachable bodies.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing a mobile apparatus including a first body, a second body, a rotary adaptor including an accommodation portion to accommodate the second body, rotatably installed on the first body, and to move the second body to a position where the second body is stacked on the first body and a position where the second body is unfolded, first magnets disposed on the accommodation portion, and second magnets disposed on the second body so as to face the corresponding first magnets and having different polarity from the corresponding first magnets.

The mobile apparatus may further include a first electric contact portion disposed on the accommodation portion, and a second electric contact portion disposed on the second body to be connected to the first electric contact portion when the second body is mounted on the rotary adaptor, wherein the first magnets and the second magnets are disposed at both sides of the first electric contact portion and both sides of the second electric contact portion.

The second body may have a long side portion and a short side portion, and the second electric contact portion and the second magnets may be disposed on at least one of the long side portion and the short side portion.

The mobile apparatus may further include third magnets that have the same polarity as one of the first magnets and the second magnets, are disposed on one of the second body and the rotary adaptor, and align the second body such that the first magnets and the second magnets are coupled with each other due to a magnetic repulsive force between the third magnets and one of the first magnets and the second magnets.

One of the first electric contact portion and the second electric contact portion may include a first terminal unit and a second terminal unit, which have symmetrical terminal arrangements.

The first electric contact portion and the second electric contact portion may be connected to each other when the first magnets and the second magnets are coupled with each other.

The mobile apparatus may further include a protrusion disposed on one of the rotary adaptor and the second body, a support disposed on the other one of the rotary adaptor and the second body so as to support the protrusion and separating the first electric contact portion and the second electric contact portion from each other, and a concave portion disposed in the support such that the protrusion is inserted into the concave portion when the first magnets and the second magnets are coupled with each other to connect the first electric contact portion and the second electric contact portion to each other.

At least one of the first magnets and the second magnets may be an electromagnet.

The second body may be a tablet computer. The first body may perform at least one function of functions of an auxiliary input device, a power supply device, and a charging station of the tablet computer.

The first body may be a main body of a portable computer, and the second body may include a display unit that is connected to the main body and displays an image.

The foregoing and/or other features and utilities of the present general inventive concept may also be achieved by providing a mobile apparatus including a body having a display screen, and having a frame with a first surface having an opening to expose the display screen, a second surface disposed opposite to the first surface, and a side portion disposed between the first and second surfaces and the rear surface and having one or more magnets disposed in the side portion of the frame of the first body.

The body may include another one or more magnets disposed in the side portion of the frame opposite to the one or more magnets with respect to the display screen.

The side portion of the frame may include one or more pairs of sides disposed opposite to each other with respect to the display screen, and the magnets may be disposed both sides of the side portion of the frame.

The side portion of the frame may include comprises one or more recesses to accommodate the corresponding magnets.

The side portion of the frame may include one or more recesses and one or more non-recesses, and the magnets may be disposed in the corresponding recesses such that the non-recesses and outside surface of the magnets form an outside surface of the side portion of the frame.

The magnets may not protrude from an outside surface of the side portion of the frame.

The magnets may have a width narrower than a thickness of the side portion of the body.

The magnets may have a length longer than a thickness of the side portion of the body between the first surface and the second surface The magnets may have a thickness in a direction parallel to the display screen thinner than a width of the magnets in a thickness direction of the side portion of the body.

The body may include an electric contact portion disposed in the side portion of the frame and exposed from the side portion of the frame, and the electric contact portion may include a first terminal for a power supply and a second terminal for a signal transmission.

The one or more magnets may be disposed apart from each other by a distance, and the body may include a processor disposed in the frame and an electric contact portion disposed in the side portion of the frame and connected to the processor.

The body may include an electric contact portion exposed through the side portion of the frame, and the electric contact portion comprises a first terminal set having terminals arranged in a first direction and a second terminal set having the terminals arranged in a second direction opposite to the first direction.

The body may include a processor and an electric contact portion connected to the processor, and the electric contact portion may include two sets of same terminals arranged in different orders.

The body may include an electric contact portion disposed between the magnets, and the electric contact portion may include two sets of same terminals arranged along the side portion of the frame or arranged parallel to each other in the side portion of the frame.

The foregoing and/or other features and utilities of the present general inventive concept may also be achieved by providing a mobile apparatus including a body having a frame, and a rotary adaptor rotatably coupled to the frame, the rotary adaptor having an accommodation portion to receive an external body and one or more magnets disposed in a bottom of the accommodation portion of the rotary adaptor.

The rotary adaptor may include an accommodation portion with a first portion, a second portion, and a third portion to provide a space to receive an external body.

The first portion and third portion may be spaced apart from each other by a width to correspond to a width of the second portion, and the magnets may be disposed in the second portion.

The second portion may have a thickness; and the magnets may be disposed in the second portion.

The rotary adaptor may include an inlet portion extended from the accommodation portion to be rotatably coupled to the frame of the body.

The accommodation portion and the inlet portion may be disposed in a direction parallel to a major surface of the keyboard.

The rotary adaptor may include an electric contact portion disposed between the magnets.

The frame may have a keyboard.

The foregoing and/or other features and utilities of the present general inventive concept may also be achieved by providing a mobile apparatus including a first body having a first frame with a keyboard, and having a rotary adaptor rotatably coupled to the frame, the rotary adaptor having an accommodation portion to receive an external body and one or more first magnets disposed in a bottom of the accommodation portion of the rotary adaptor, and a second body having a display screen, and having a second frame with a first surface having an opening to expose the display screen, a second surface disposed opposite to the first surface, and a side portion disposed between the first and second surfaces and the rear surface and having one or more second magnets disposed in the side portion of the frame of the first body to correspond to the magnets of the rotary adaptor of the first body.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
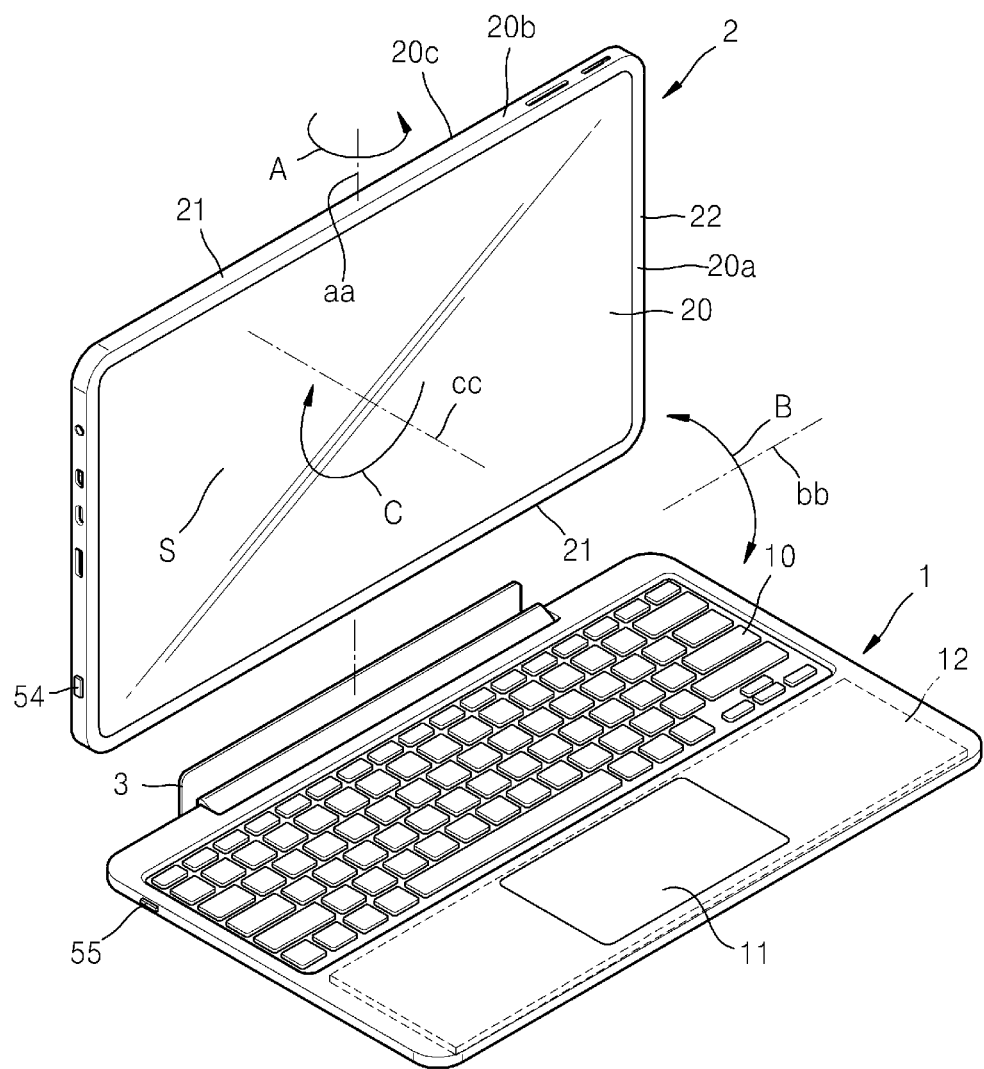
FIG. 1 is an exploded perspective view illustrating a mobile apparatus in a state where a second body is separated from a first body, according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

FIGS. 1 through 4 are perspective views illustrating a mobile apparatus according to an embodiment of the present general inventive concept. Referring to FIG. 1, the mobile apparatus includes a first body 1 and a second body 2. The first body 1 and the second body 2 may be detachably attached to each other. The second body 2 may be separately carried from the first body 1.

The mobile apparatus may be, for example, a portable computer. In this case, the first body 1 may be a body of a portable computer, for example, a notebook computer including a processor and a memory. The first body 1 may include a keyboard 10, a pointing device 11, and a power supply including a battery 12 to receive an external power and to store the power in battery cells such that the external power or stored power can be used in the mobile apparatus and/or the first and second bodies 1 and 2. In addition, the first body 1 may include various input components including one or more processors as controller or functional units to manipulate the mobile apparatus and to perform functions of the mobile apparatus. The second body 2 may include a display unit 20 to display an image on a screen S. The display unit 20 may be, for example, a liquid crystal display device, a flat display device including an organic light-emitting device, or the like. The display unit 20 may include a touch screen panel with the screen S to output an image as a display unit and to input data or user commands as a keyboard. It is possible that the second body may perform functions of the first body 1 of the mobile apparatus when the first body 2 of the mobile apparatus is connected to the second body 2 through a wired or wireless method. Although not illustrated in FIGS. 1 through 4, the first body 1 and/or the second body 2 may include a speaker to output a sound. In addition, the first body 1 and/or the second body 2 may include various standards of input/output ports (not illustrated) to input and output an audio signal, to input and output an image signal, and to connect the mobile apparatus to an external device, and a power supply inlet/outlet (not illustrated) to receive the external power from an external device as an external power source.

The second body 2 may be a tablet computer. The second body 2 may include one or more processors to manipulate the second body 2 and/or to perform one or more functions of the second body 2 and/or the mobile apparatus, and a power supply including a battery (not illustrated) to receive an external power and to store the power in battery cells such that the external power or stored power can be used in the second body 2 or the mobile apparatus or can be used to drive the one or more processors, a memory to store data such that the one or more processors can process data according to the data stored in the memory, data received from the first body 1 or data received from an external apparatus, and the display unit 20 including a screen S to provide an image to a user. The screen S may be a touch screen to provide an image and to receive a user data or command. The second body 2 may include a communication module that may communicate with an external device or apparatus via a wireless or wire/wireless communication method. In this case, the first body 1 may be a docking station that functions as an auxiliary input device, a power supplying device, a charging station, and/or the like of a tablet computer. The first body 1 may include the keyboard 10, the pointing device 11, and the battery 12. In this case, the first body 1 and/or the second body 2 may include a speaker, various standards of input/output ports (not illustrated), and a power supply inlet/outlet (not illustrated) to receive and supply power.

The second body 2 may have a first (front) surface 20a having an opening to expose the screen S of the display unit 20, a third (rear) surface 20c, and a side surface (side portion) 20b disposed or formed between the first surface 20a and the second surface 20c to provide a thickness of the second body 2. The second body 2 may rotate in a direction A, B, or C with respect to the first body 1 or a reference axis aa, bb, or cc.

Figure 2:
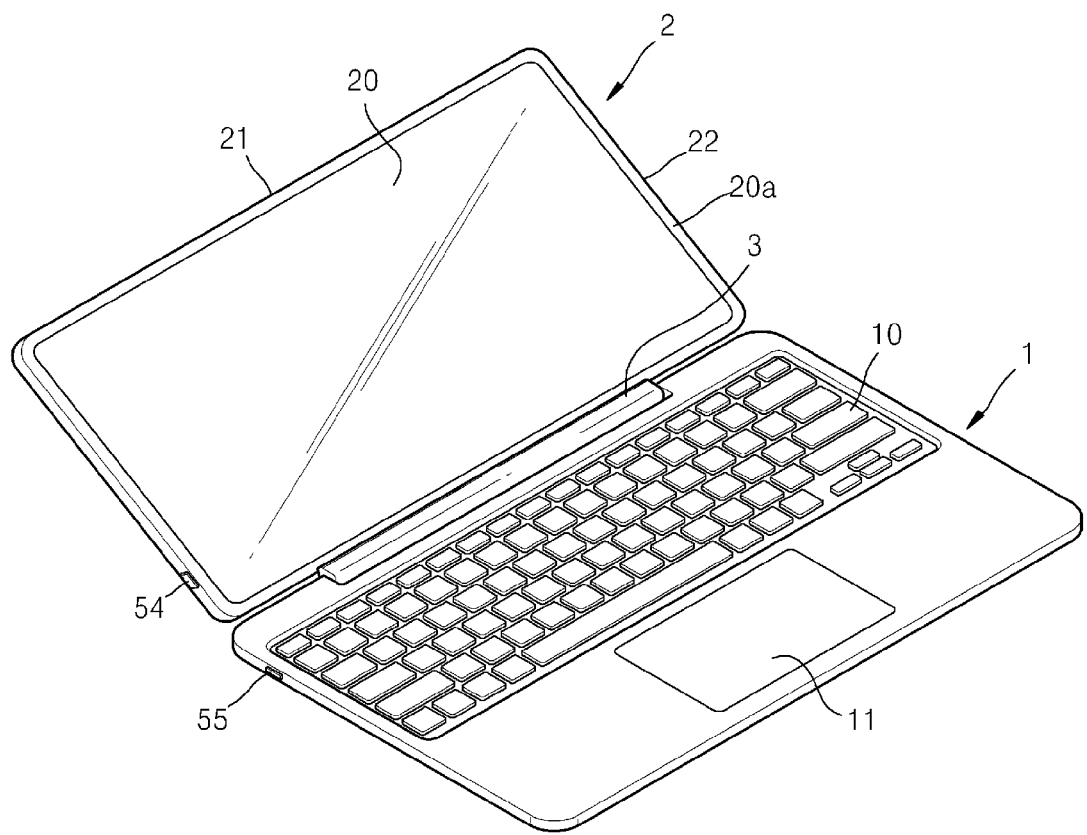
FIG. 2 is a perspective view illustrating a mobile apparatus in a state where a second body is coupled with a rotary adaptor and is inclined with respect to the first body, according to an embodiment of the present general inventive concept.

The second body 2 may be coupled with the first body 1. The mobile apparatus may include a rotary adaptor 3 which may be provided in or installed on the first body 1 to accommodate the second body 2. The rotary adaptor 3 may be rotatably installed on the first body 1. As illustrated in FIG. 2, the second body 2 may be coupled with the rotary adaptor 3. In this state, when a user pushes or pulls the second body 2 to rotate the rotary adaptor 3 in the direction B, the second body 2 rotates with respect to the first body 1 at a predetermined angle in the direction B.

Figure 3:
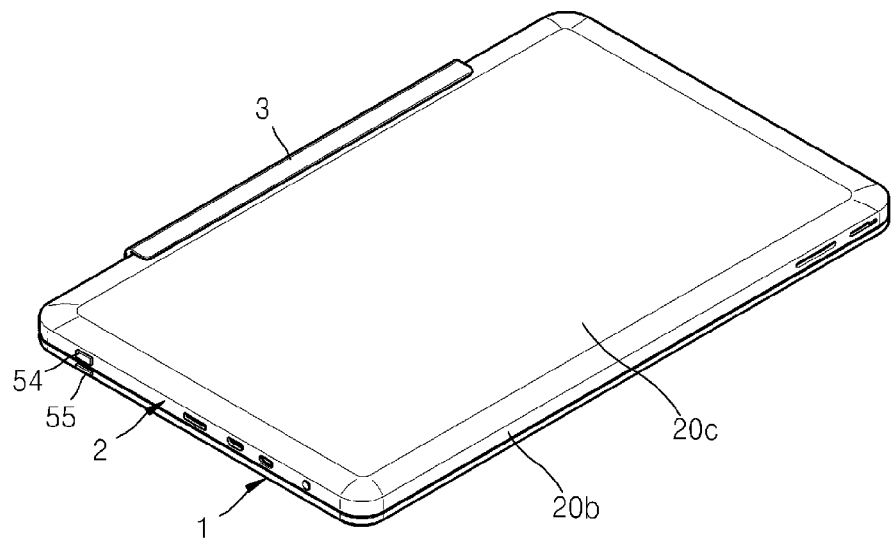
FIG. 3 is a perspective view illustrating a mobile apparatus in a state where a second body is stacked on a first body according to an embodiment of the present general inventive concept.

When the user does not use the mobile apparatus, the user may completely stack the second body 2 on the first body 1 in a folding state from an unfolding state, as illustrated in FIG. 3. The folding state and the unfolding state may be either one of an operable state and an inoperable state.

Figure 4:
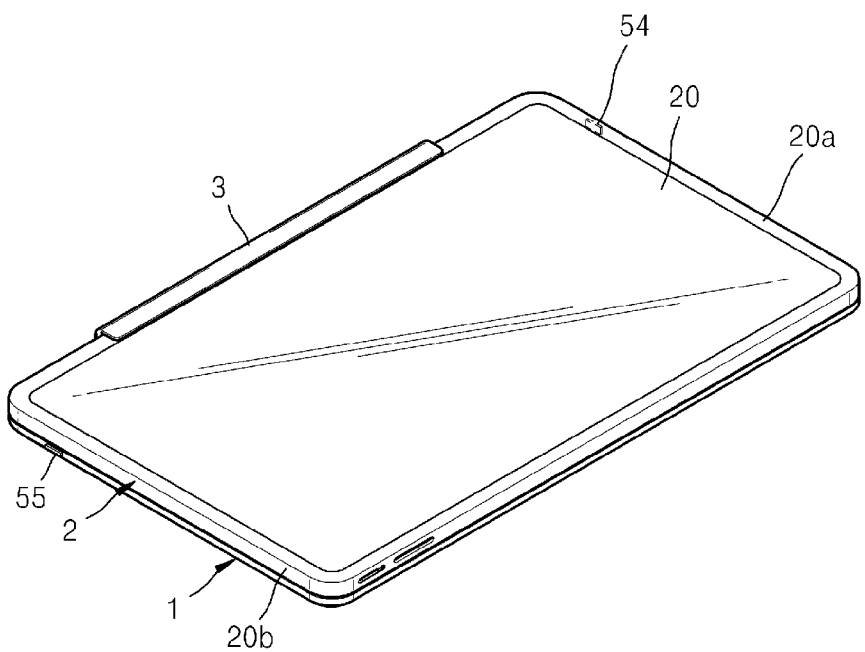
FIG. 4 is a perspective view illustrating a mobile apparatus in a state where a second body is stacked on a first body so that a display unit is positioned upward according to an embodiment of the present general inventive concept.
Figure 5:
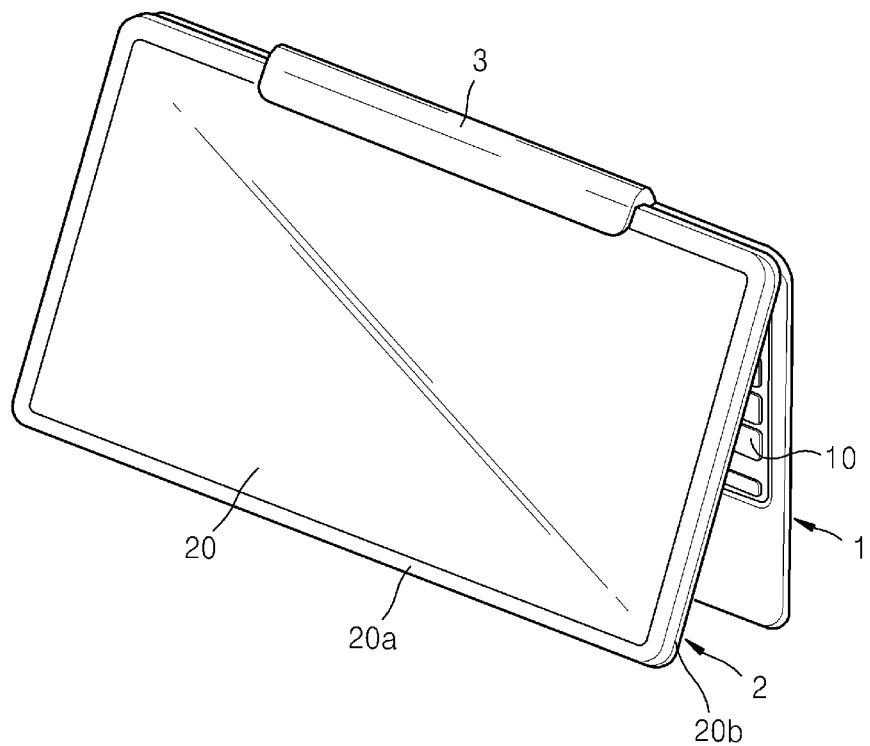
FIG. 5 is a perspective view illustrating a mobile apparatus in a state where first and second bodies are disposed on a reference surface to be in a usable state, according to an embodiment of the present general inventive concept.

As illustrated in FIG. 1, the user may rotate the second body 2 in a direction A at 180 degrees to couple the second body 2 with the rotary adaptor 3, and may rotate the second body 2 in a direction B to stack the second body 2 on the first body 1. Thus, as illustrated in FIG. 4, the display unit 20 may be exposed to an outside of the mobile apparatus in a folding state. In this case, the folding state of the mobile apparatus may be in an operable state. The user may rotate the second body 2 with respect to the first body 1 in the direction B at a predetermined angle to an unfolding state such that the unfolded state of the first and second bodies 1 and 2 can also be in the operable state as illustrated in FIG. 5.

Figure 6:
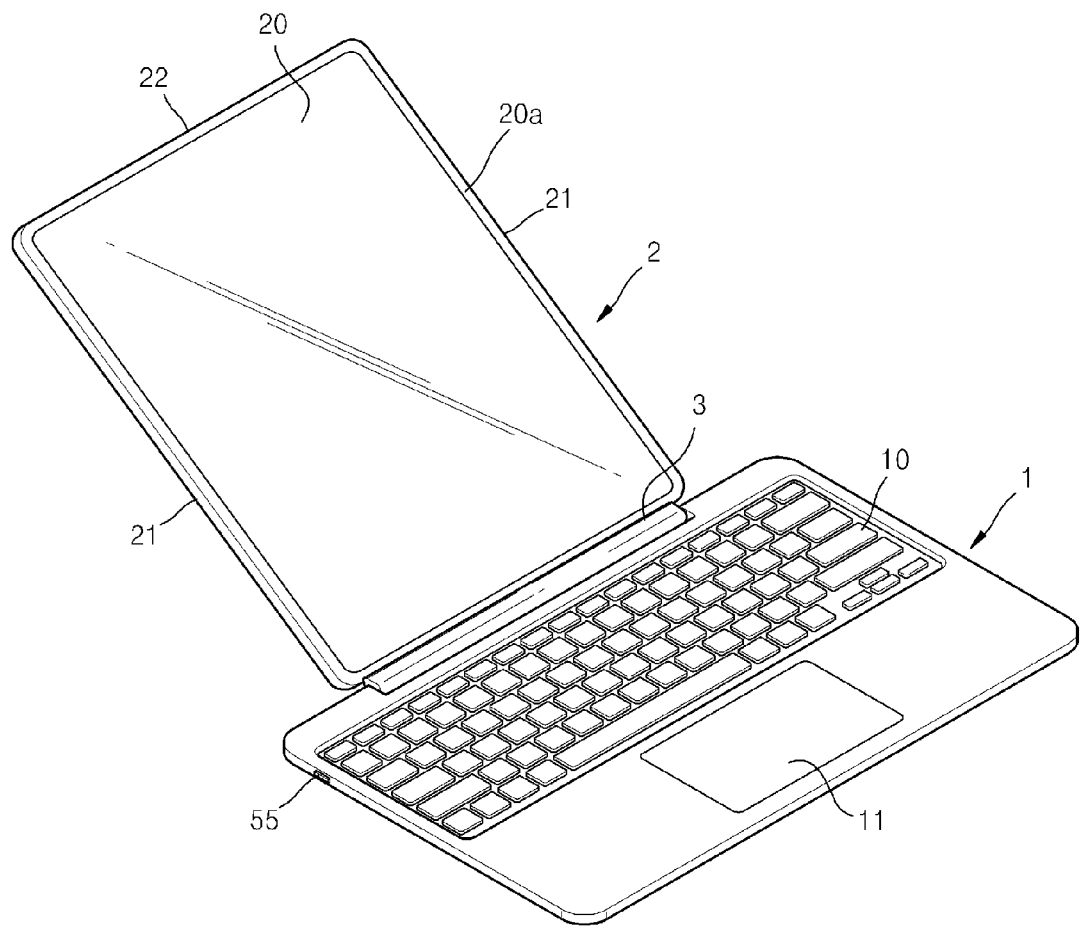
FIG. 6 is a perspective view illustrating a mobile apparatus in a state where a short side portion of a second body is coupled with a rotary adaptor, according to an embodiment of the present general inventive concept.

The second body 2 may have a rectangular shape and may have a long side portion 21 and a short side portion 22 in the side surface 20b. In this case, when a user does not rotate the second body 2 in a direction C of FIG. 1, the long side portion 21 of the side surface 20b of the second body 2 may be coupled with the rotary adaptor 3 as illustrated in FIG. 2. As illustrated in FIG. 6, the short side portion 22 of the second body 2 may be coupled with the rotary adaptor 3 when the second body 2 rotates in the direction C of FIG. 1. The long side portion 21 and the short side portion 22 may have a first length and a second length. The first length and the second length may be different. However, it is possible that the first length and the second length may be same.

Although FIG. 6 illustrates that the rotary adaptor 3 has a length to correspond to the second length of the short side portion 22 of the second body 2, the present general inventive concept is not limited thereto. It is possible that the rotary adaptor 3 may have a length to correspond to the first length of the long side portion 21 of the second body 2 such that the rotary adaptor 3 can accommodate either one of the long side portion 21 and the short side portion 22 of the second body 2.

Figure 7:
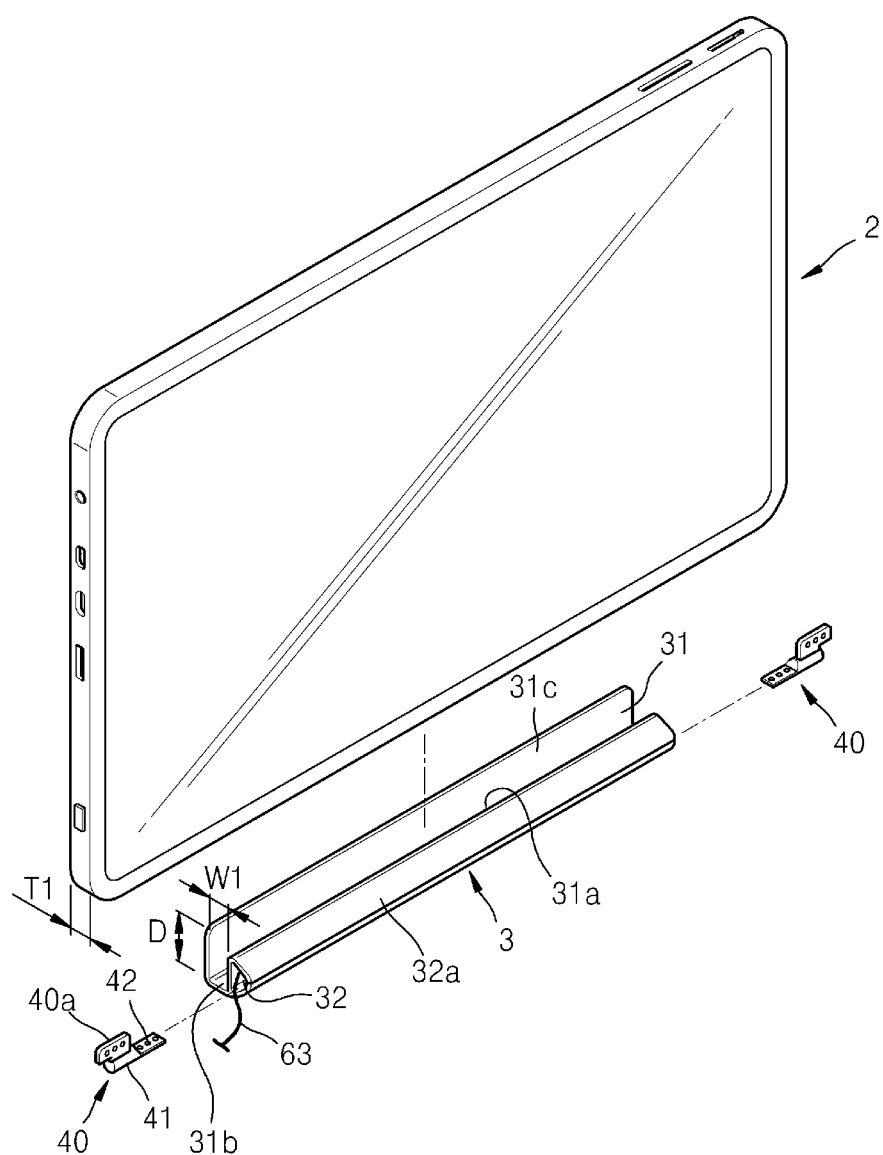
FIG. 7 is an exploded perspective view illustrating a coupling relationship between a rotary adaptor and a second body according to an embodiment of the present general inventive concept.

FIG. 7 is an exploded perspective view illustrating a coupling relationship between the rotary adaptor 3 and the first body 1 and the second body 2 of the mobile apparatus. Referring to FIG. 7, the rotary adaptor 3 may include an accommodation portion 31 to accommodate the second body 2. For example, the accommodation portion 31 may have a "U" shape portion so that the second body 2 may be inserted into the U shape portion of the accommodation portion 31, and the accommodation portion 31 may have a width W1 so as to accommodate a thickness T1 of the second body 2. In order to secure accommodation portion 31 and the second body 2, it is sufficient to determine a depth D of the accommodation portion 31 as long as the second body 2 may not fall down or apart from a coupling state while being accommodated in the accommodation portion 31. The width W1 of the accommodation portion 31 may be determined so that the second body 2 may not move excessively in a width direction while being inserted into the accommodation portion 31.

The "U" shape portion of the accommodation portion 31 may have a first portion 31a, a second portion 31b, and a third portion 31c. The first portion 31a and the third portion 31c are spaced apart from each other by the width W1 and have heights to correspond to the depth D. It is possible that one of the heights of the first portion 31a and the third portion 31c can be longer than the other one of the heights of the first portion 31a and the second portion 31c. For example, the height of the third portion 31c is longer than the height of the first portion 31a. Although FIG. 7 illustrate that the depth D corresponds to the height of the third portion 31c, it is possible that the depth D can correspond to the height of the first portion 31a. In this case, a portion of the height of the third portion 31c higher than the depth or the height of the first portion 31a may be used to additionally support the second body 2 with respect to the rotary adaptor 3 and/or the first body 1 of the mobile apparatus in the coupling state. The second portion 31b of the accommodation portion 31 may be used as a bottom of the accommodation portion 31 to correspond to the width W1 of the accommodation portion 31 and/or the thickness T1 of the second body 2.

The first portion 31a, the second portion 31b, and the third portion 31c of the accommodation portion 31 may be formed in a single integrated or monolithic body and may have a strength enough to support the coupling state, the rotation state, and the operation state of the second body 2, the first body 1, and/or the rotary adaptor 3. The first portion 31a and the third portion 31c may be extended from the second portion 31b at both ends thereof in the direction parallel to the axis aa of FIG. 1. The first portion 31a, the second portion 31b, and the third portion 31c of the accommodation portion 31 may be formed and extended in a lengthwise parallel to the direction bb of FIG. 1. It is possible that the accommodation portion 31 may have a reinforcement element (not illustrated) formed on at least one of the first portion 31a, the second portion 31b, and the third portion 31c in a direction corresponding to the axis bb of FIG. 1 or in a direction formed along surfaces of the first portion 31a, the second portion 31b, and the third portion 31c. The reinforcement element may provide an additional strength to the accommodation portion 31 to support the coupling state, the rotation state, and the operation state of the second body 2, the first body 1, and/or the rotary adaptor 3.

The first body 1 may include hinge portions 40 each having a coupling portion 40a and a rotary shaft 41. The coupling portion 40a of the hinge portions 40 may be fixedly mounted on the first body 1, and the rotary shaft 41 may be rotatably mounted in the corresponding hinge portion 40 such that the rotary shaft 41 can rotate with respect to the coupling portion 40a of the hinge portion 40 and/or the first body 1. The hinge portion 40 may include a rotary prevention portion 42 formed on, extended from, or coupled to the rotary shaft 41 such that the hinge portion 40 can be connected between the first body 1 and the rotary adaptor 3 through the coupling portion 40a, the rotary shaft 41 and/or the rotary prevention portion 41. Although not illustrated in FIG. 7, the hinge portion 40 includes a rotation resistance providing component to provide a rotation resistance force to the rotary shaft 41 with respect to the hinge portion 40. The rotation resistance providing component may apply a rotation resistance force to the rotary shaft 41 by combining an elastic member and a friction washer, for example. Since the hinge portion 40 may be well known, a detailed description thereof is omitted herein.

Figure 8:
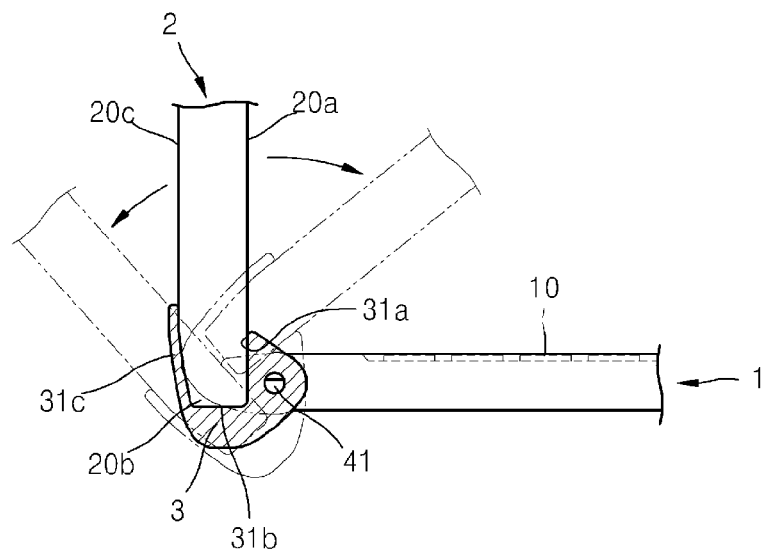
FIG. 8 is a side cross-sectional view illustrating a mobile apparatus in a state where a second body is coupled with a rotary adaptor to be rotatable with respect to a first body, according to an embodiment of the present general inventive concept.

It is possible that one end of the hinge portion 40 can be coupled to a portion of the first body 1. That is, the one end of the hinge portion 40 can be coupled to a side portion of the first body 1. However, it is also possible that the one end of the hinge portion 40 can be coupled an upper portion of the first body 1. It is also possible that the first body 1 may have a side to provide a recess to accommodate the hinge portions 40 and the coupling and rotation of the second body 2 with the respect to the rotary adaptor 3 and the first body 1, and that the hinge portions 40 may be coupled to both ends of the side of the first body 1 such that the accommodation portion 31 and the inlet portion 32a of the rotary adaptor 3 can be disposed to rotate with respect to the first body 1 in the direction B of FIG. 1 without interrupting any portion of the first body 1. The second body 2 may rotate in the direction B around a distal end of a side of the first body 1, as illustrated in FIG. 8.

The rotary adaptor 3 may include an insertion inlet 32 into which the rotary shaft 41 is inserted. The rotary adaptor 3 may include an inlet portion 32a to form the insertion inlet 32. The inlet portion 32a may be extended from the first portion 31a to provide a space to accommodate an electrical connection between the first body 1 and the second body 2, for example, an electric signal line 63 and also to provide a space to receive the hinge portion 40. The rotary shaft 41 may be coupled with the rotary adaptor 3 via a coupler, for example, a screw or the like. It is possible that the rotary shaft 41 may be inserted into the insertion inlet 32 via a press fitting method. For example, the rotation prevention portion 42 may be formed on an end of the rotary shaft 41 so that the rotary shaft 41 may not rotate in the insertion inlet 32. The rotation prevention portion 42 may be, for example, a D-cut portion that has a "D" shape cross section and is formed by partially surface-processing an end of the rotary shaft 41 having a circular cross section. Correspondingly, the insertion inlet 32 of the rotary adaptor 3 may have similar shape to or the same shape as the rotation prevention portion 42.

By using the above-described structure, the second body 2 may be coupled with the first body 1 by inserting the long side portion 21 or the short side portion 22 of the second body 2 into the accommodation portion 31 of the rotary adaptor 3. The first body 1 and the second body 2 can be rotatable about an axis of the rotary shaft 41 as illustrated in FIG. 8. In this state, by pushing or pulling the second body 2 and rotating the rotary adaptor 3 with respect to the first body 1, an inclination angle of the second body 2 with respect to the first body 1 may be adjusted. As illustrated in FIG. 3, the second body 2 may completely stack on the first body 1 in a folded state.

It is necessary to maintain a state in which the second body 2 is coupled with the rotary adaptor 3. To this end, the mobile apparatus according to the present embodiment may include a coupler to couple the second body 2 with the rotary adaptor 3. A coupling method may be a method using shapes of the second body 2 and the rotary adaptor 3, such as a snap-fit method or the like. However, a method using a shape may affect an outer appearance of the second body 2 and a structural addition or change may affect an exterior design of the second body 2. When the second body 2 is capable of being independently usable as a tablet computer, the structural addition or change is determined according to a user or manufacturer preference to maintain or improve the exterior design of the second body 2 or may minimize affecting on an outer appearance of the second body 2.

Figure 9:
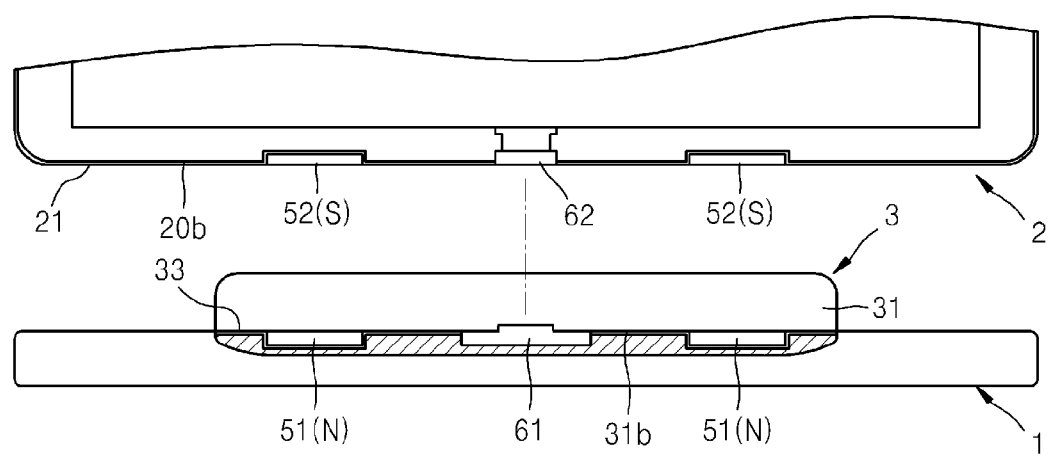
FIG. 9 is a cross-sectional view illustrating a coupler to couple a second body to a rotary adaptor by using a magnetic force, according to an embodiment of the present general inventive concept.

Accordingly, the coupler according to the present embodiment may couple the second body 2 with the rotary adaptor 3 by using a magnetic force. Referring to FIG. 9, one or more first magnets 51 or one or more pairs of magnets are disposed in a corresponding recess portion of the second portion 31b of the accommodation portion 31 of the rotary adaptor 3. External surfaces of the first magnets 51 and non-recess portions of the second portion 31b may form a bottom surface 33 of the accommodation portion 31 to face the second body 2. One or more magnets 52 or one or more pairs of magnets are disposed in, for example, a corresponding recess portion of the side surface 20b, for example, the side surface 20b of the long side portion 21 of the second body 2. External surface of the second magnets 52 and non-recess portions of the side surface 20b may form an external surface (appearance) of the second body 2. The first magnets 51 and the second magnets 52 may have opposite polarities. For example, the first magnets 51 may be an N pole (N polarity) and the second magnets 52 may be an S pole (S polarity).

When no cover is disposed on the first magnets 51 or the second magnets 52, the first magnet 51 or the second magnets 52 may be exposed to an outside of the second portion 31b of the rotary adaptor 3 or the side surface 20b of the second body 2.

It is possible that when a cover (not illustrated) may be disposed on the external surfaces of the first magnets 51 and/or non-recessed portions of the second portion 31b, an external surface of the cover may form the a bottom surface 33 of the accommodation portion 31 to face the second body 2. It is also possible that when a cover may be disposed on the external surfaces of the second magnets 52 and/or the non-recess portions of the side surface 20b of the second body 2, an external surface of the cover may form the external surface of the side portion 20b.

It is possible that one of the first magnets 51 and the second magnets 52 can be a permanent magnet and the other one of the first magnets 51 and the second magnets 52 may be an electromagnet to generate a force with the permanent magnet. It is also possible that the first magnets 51 and the second magnets 52 can be either one of a permanent magnet and an electromagnet.

When the long side portion 21 of the second body 2 is inserted into the accommodation portion 31, the second body 2 may be coupled with the rotary adaptor 3 by using a magnetic attractive force between the first magnets 51 and the corresponding second magnets 52. By using the coupler based on a magnetic force, when the second body 2 is disposed as indicated by dotted lines in FIG. 10, or when the second body 2 is inserted into the rotary adaptor 3 from a position indicated as the dotted lines of FIG. 10, even though the second body 2 is not aligned with but deviated from the rotary adaptor 3, the second body 2 is moved to a coupling position or a fit position so that the second magnets 52 may respectively face the corresponding first magnets 51 due to the magnetic attractive force between the first magnets 51 and the second magnets 52. Thus, the second body 2 and the first body 1 may be aligned with each other, as indicated by a solid line in FIG. 10.

Figure 11:
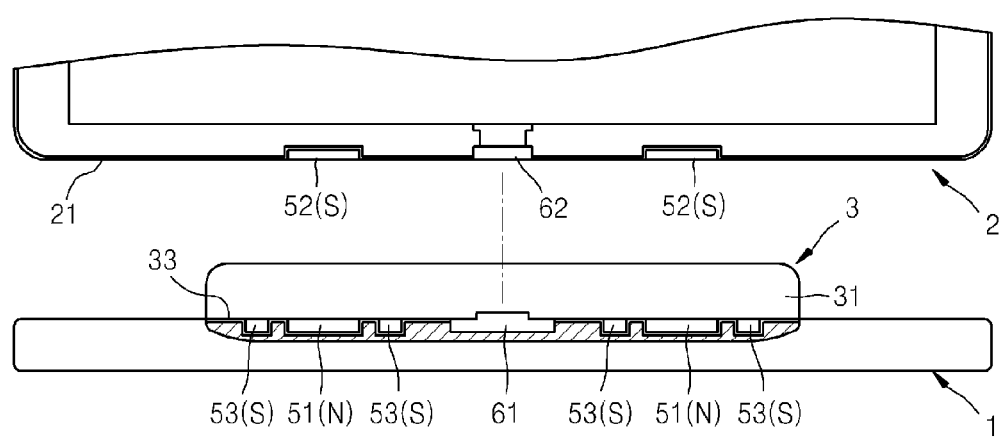
FIG. 11 is a cross-sectional view illustrating a coupler to couple a second body with a rotary adaptor by using a magnetic force, according to an embodiment of the present general inventive concept.

The rotary adaptor 3 may further include third magnets 53 to additionally provide the secure alignment and coupling of the first body 1 and the second body 2. The third magnets 53 may be disposed on the second body 2 or the rotary adaptor 3. For example, FIG. 11 illustrates a coupler in a case where the third magnets 53 are disposed on the rotary adaptor 3. In this case, the third magnets 53 may have the same polarity as the second magnets 52. For example, in FIG. 11, the third magnets 53 may each correspond to the S pole. The third magnets 53 may be disposed at one side or two sides of each of the first magnets 51. Although not illustrated, the third magnets 53 may be disposed on the second body 2. In this case, the third magnets 53 may correspond to the same polarity as the polarity of the first magnets 51, for example, the N pole. In addition, the third magnets 53 may be disposed at one side or two sides of each of the second magnets 52.

Figure 10:
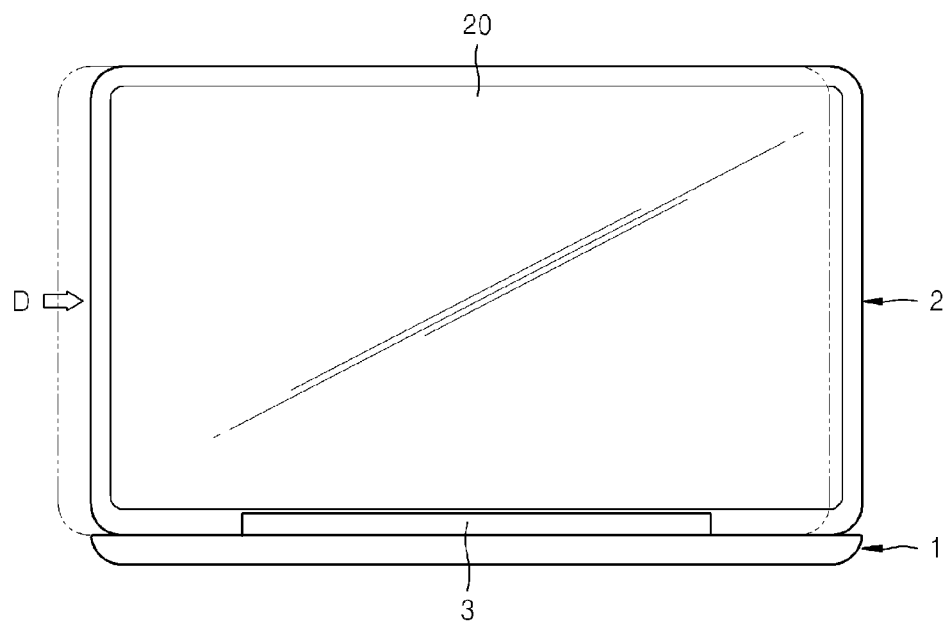
FIG. 10 is a diagram illustrating a mobile apparatus in a state where a second body is aligned with a first body by using a magnetic force, according to an embodiment of the present genera inventive concept.

As indicated by dotted lines in FIG. 10, when the second body 2 is inserted into the accommodation portion 31 of the rotary adaptor 3, the second magnets 52 is inserted adjacent to, for example, the third magnets 53 rather than being respectively aligned with the first magnets 51. In this case, since the third magnets 53 and the second magnets 52 have the same polarity, a magnetic repulsive force acts between the third magnets 53 and the second magnets 52. Due to the magnetic repulsive force, the second body 2 is moved in an arrow direction D. When the second body 2 is moved in the arrow direction B due to the magnetic repulsive force, the second body 2 is attracted in the arrow direction D due to the magnetic attractive force between the first magnets 51 and the second magnets 52, and the first magnets 51 and the second magnets 52 may be aligned with each other so as to face each other. In addition, as indicated by the solid line of FIG. 10, a state in which the second body 2 may be aligned with the first body 1 may be maintained due to the magnetic attractive force between the first magnets 51 and the second magnets 52.

FIGS. 9 and 11 illustrate a coupler having a pair of first magnets 51 and a pair of second magnets 52 corresponding thereto. However, the present general inventive concept is not limited thereto. If necessary, three or more first magnets 51 and three or more second magnets 52 may be used.

In order to insert the short side portion 22 of the second body 2 into the rotary adaptor 3, as illustrated in FIG. 6, the second magnets 52 may also be disposed on the short side portion 22 in a similar way to FIGS. 9 and 11.

At least one of the first magnet 51 and the second magnet 52 may be an electromagnet. A function of the electromagnet may be on or off by shutting on or off an electrical signal to be applied thereto. When the second body 2 is mounted on the rotary adaptor 3, a function of the electromagnet is on. When the second body 2 is detached from the rotary adaptor 3, the magnetic attractive force between the first magnets 51 and the second magnets 52 may be removed by turning off the function of the electromagnet. Thus, the second body 2 may be easily detached from the rotary adaptor 3 by using a weak force. In order to turning on or off the function of the electromagnet, the second body 2 may have a switch 54 and the first body 1 may have a switch 55 (see FIGS. 1-4) may be disposed on at least one of the first body 1 and the second body 2. For example, the switch 54 or 55 (see FIG. 1) may shut off power supplied from a battery installed in the first body 1 or the second body 2 to the first magnets 51 or the second magnets 52 to turn off the functions of the first magnets 51 or the second magnets 52. In addition, the switch 54 or 55 may supply power from the battery installed in the first body 1 or the second body 2 to the first magnets 51 or the second magnets 52 so that the first magnets 51 or the second magnets 52 may have opposite polarities to the second magnets 52 or the first magnets 51, and thus, the magnetic attractive force between the first magnets 51 and the second magnets 52 may be generated or removed.

Figure 12:
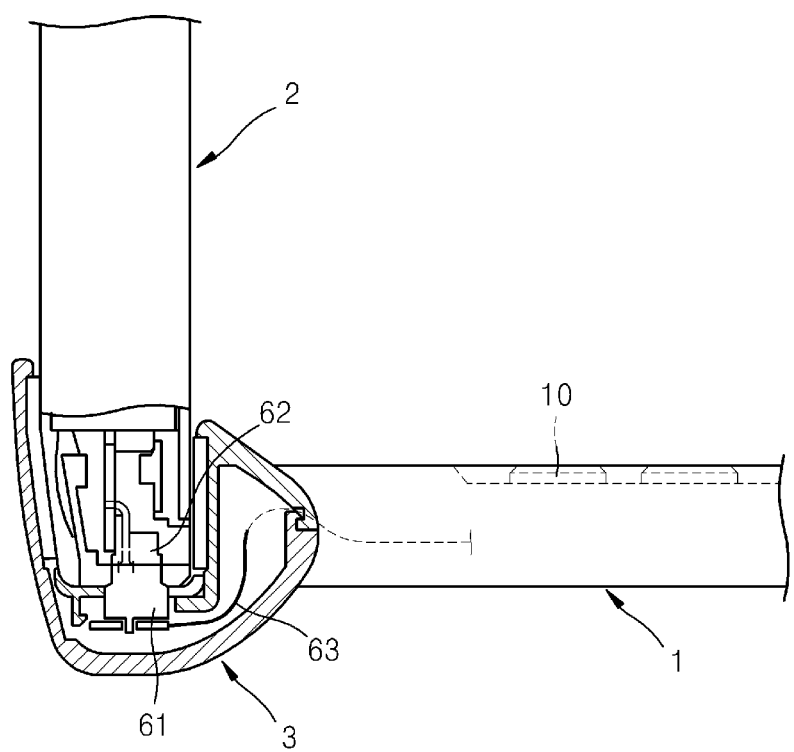
FIG. 12 is a side cross-sectional view illustrating a mobile apparatus having first and second electric contact portions, according to an embodiment of the present general inventive concept.

The second body 2 may be electrically connected to the first body 1 when being mounted on the rotary adaptor 3. To this end, as illustrated in FIGS. 9, 11, and 12, a first electric contact portion 61 may be disposed on the rotary adaptor 3 and a second electric contact portion 62 may be disposed on the second body 2. For example, the first electric contact portion 61 may be disposed on the bottom surface 33 of the accommodation portion 31 of the rotary adaptor 3. Referring to FIGS. 6 and 12, the first electric contact portion 61 may be electrically connected to the first body 1 via an electric signal line 63 that extends inside the rotary adaptor 3 through a space between the rotary shaft 41 of the hinge portion 40 and the insertion inlet 32 of the rotary adaptor 3. As another example, the first electric contact portion 61 may be electrically connected to the first body 1 via the electric signal line 63 that extends inside the rotary adaptor 3 through a hollow portion (not illustrated) formed in the rotary shaft 41 of the hinge portion 40.

Accordingly, when the second body 2 is accommodated in the accommodation portion 31 of the rotary adaptor 3, and the first magnets 51 and the second magnets 52 are aligned with each other to face each other, the second body 2 is coupled with the rotary adaptor 3 due to a magnetic attractive force between the first magnets 51 and the second magnets 52, and the first electric contact portion 61 and the second electric contact portion 62 are electrically connected to each other. Thus, the first body 1 and the second body 2 are electrically connected to each other, and an electrical signal such as a power signal, a driving signal, a manipulation signal, an image signal, or the like may be transferred between the first body 1 and the second body 2. To this end, a power terminal, a manipulation signal terminal, a driving signal terminal, an image signal terminal, or the like may be formed on the first and second electric contact portions 61 and 62.

Corresponding terminals from among the above-described terminals need to be electrically connected to each other. However, as indicated by the dotted lines in FIG. 10, when the second body 2 is not aligned but deviated from the first body 1 and is accommodated on the accommodation portion 31 of the rotary adaptor 3, incongruent terminals from among the above-described terminals may be electrically connected to each other. To prevent this, referring to FIGS. 13 and 14, protrusions 71 may protrude from the long side portion 21 of the second body 2 and supports 72 may be formed on the accommodation portion 31 of the rotary adaptor 3 to correspond to the corresponding protrusions 71. For example, the supports 72 may correspond to the bottom surface 33 of the accommodation portion 31. Concave portions 73 into which the protrusions 71 are inserted may be formed in the supports 72. A protruding degree C. of each of the protrusions 71 may be appropriately determined so that the second electric contact portion 62 may be spaced apart from the first electric contact portion 61.

Figure 13:
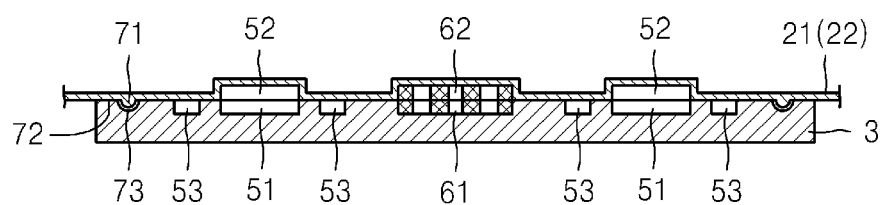
FIGS. 13 and 14 are cross-sectional views illustrating a coupling state of a mobile apparatus having protrusions, supports, and concave portions, according to an embodiment of the present general inventive concept.
Figure 14:
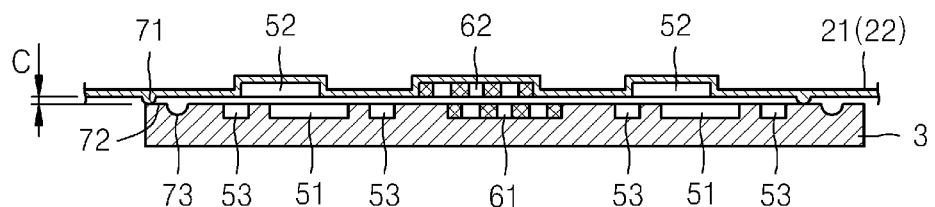

Due to this structure, referring to FIG. 14, when the second body 2 is disposed to be inserted into the accommodation portion 31 and is deviated from the first body 1, the protrusions 71 are supported by the supports 72 and the second electric contact portion 62 is spaced apart from the first electric contact portion 61 upward, and thus, the first electric contact portion 61 and second electric contact portion 62 are separated from each other. In addition, when the second body 2 is moved in the arrow direction D (FIG. 10) due to the magnetic repulsive force between the third magnets 53 and the second magnets 52 so that the first magnets 51 and the second magnets 52 may face each other, the protrusions 71 face the concave portions 73 and the second body 2 is moved downward so that the protrusions 71 is inserted into the concave portions 73, and terminals having the same function of the first electric contact portion 61 and the second electric contact portion 62 may be connected to each other, as illustrated in FIG. 13.

Since a pair of first magnets 51 and a pair of second magnets 52 are disposed at both sides of the first electric contact portion 61 and both sides of the second electric contact portion 62, respectively, the coupling force of the first magnets 51 and the second magnets 52 provides the stability of the electrical connection between the first electric contact portion 61 and the second electric contact portion 62.

As illustrated in FIG. 6, in order to insert the short side portion 22 of the second body 2 into the second body 2, although not illustrated, the second electric contact portion 62 and the protrusions 71 may also be formed on the short side portion 22 of the second body 2.

In the above-described embodiment, the protrusions 71 are disposed on the second body 2 and the supports 72 and the concave portions 73 are disposed on the rotary adaptor 3. However, the present general inventive concept is not limited thereto. The protrusions 71 may be disposed on the rotary adaptor 3 and the supports 72 and the concave portions 73 may be disposed on the second body 2.

The protrusions 71, the supports 72, and the concave portions 73 may perform a valuable function of aligning the second body 2 and the first body 1 with each other without the first and second electric contact portions 61 and 62. When the second body 2 is deviated from the first body 1 and is inserted into the accommodation portion 31 of the rotary adaptor 3, the protrusions 71 is supported by the supports 72, thereby reducing friction between the second body 2 and the rotary adaptor 3. Thus, the second body 2 may be easily moved to an alignment position where the first magnets 51 and the second magnets 52 face each other due to a magnetic repulsive force between the third magnets 53 and the first magnets 51 or the second magnets 52. In addition, the second body 2 may be moved to a position where the protrusions 71 are inserted into the concave portions 73 due to a magnetic repulsive force between the third magnets 53 and the first magnets 51 or the second magnets 52. Thus, together with magnetic forces of the first magnets 51 and the second magnets 52, the protrusions 71 and the concave portions 73 may maintain the alignment of the second body 2.

Referring to FIGS. 3 and 4, the second body 2 may also be coupled with the rotary adaptor 3 when rotating with respect to the first body 1 at 180 degrees in the direction A of FIG. 1. In this case, the first and second electric contact portions 61 and 62 may have structures to be electrically connected to each other also when the second body 2 rotates at 180 degrees. To this end, one of the first and second electric contact portions 61 and 62 may include two terminals having symmetrical structures.

Figure 15:
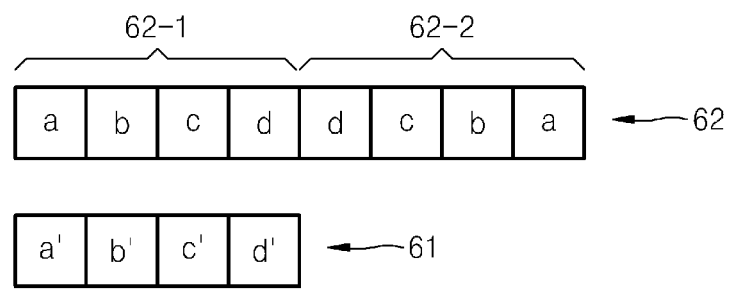
FIGS. 15 and 16 are diagrams illustrating a mobile apparatus having first and second electric contact portions having symmetrical terminal arrangements according to an embodiment of the present general inventive concept

Referring to FIG. 15, the second electric contact portion 62 includes a first terminal unit 62-1 and a second terminal unit 62-2, which have symmetrical terminal arrangements. Due to this structure, for example, when the second body 2 is coupled with the rotary adaptor 3, as illustrated in FIG. 3, the first terminal unit 62-1 is coupled with the first electric contact portion 61. In addition, when the second body 2 rotates at 180 degrees in the directions A and/or C and is coupled with the rotary adaptor 3, as illustrated in FIG. 4, the second terminal unit 62-2 is coupled with the first electric contact portion 61. Thus, a-a', b-b', c-c', and d-d' terminals of the first electric contact portion 61 and the second electric contact portion 62 may be connected to each other in either one of coupling states of FIGS. 3 and 4.

Figure 16:
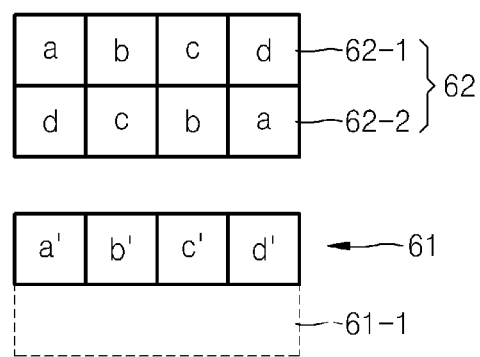

The first and second terminal units 62-1 and 62-2 may be arranged like in FIG. 16. In this case, when the second body 2 is coupled with the rotary adaptor 3, as illustrated in FIG. 3, the first terminal unit 62-1 is connected to the first electric contact portion 61 and the second terminal unit 62-2 faces a dummy portion 61-1. In addition, when the second body 2 rotates by 180 degrees in the direction D and is coupled with the rotary adaptor 3, as illustrated in FIG. 4, the second terminal unit 62-2 is connected to the first electric contact portion 61 and the first terminal unit 62-1 face the dummy portion 61-1. Thus, a-a', b-b', c-c', and d-d' terminals of the first electric contact portion 61 and the second electric contact portion 62 may be connected to each other in either one of coupling states of FIGS. 3 and 4.

Figure 17:
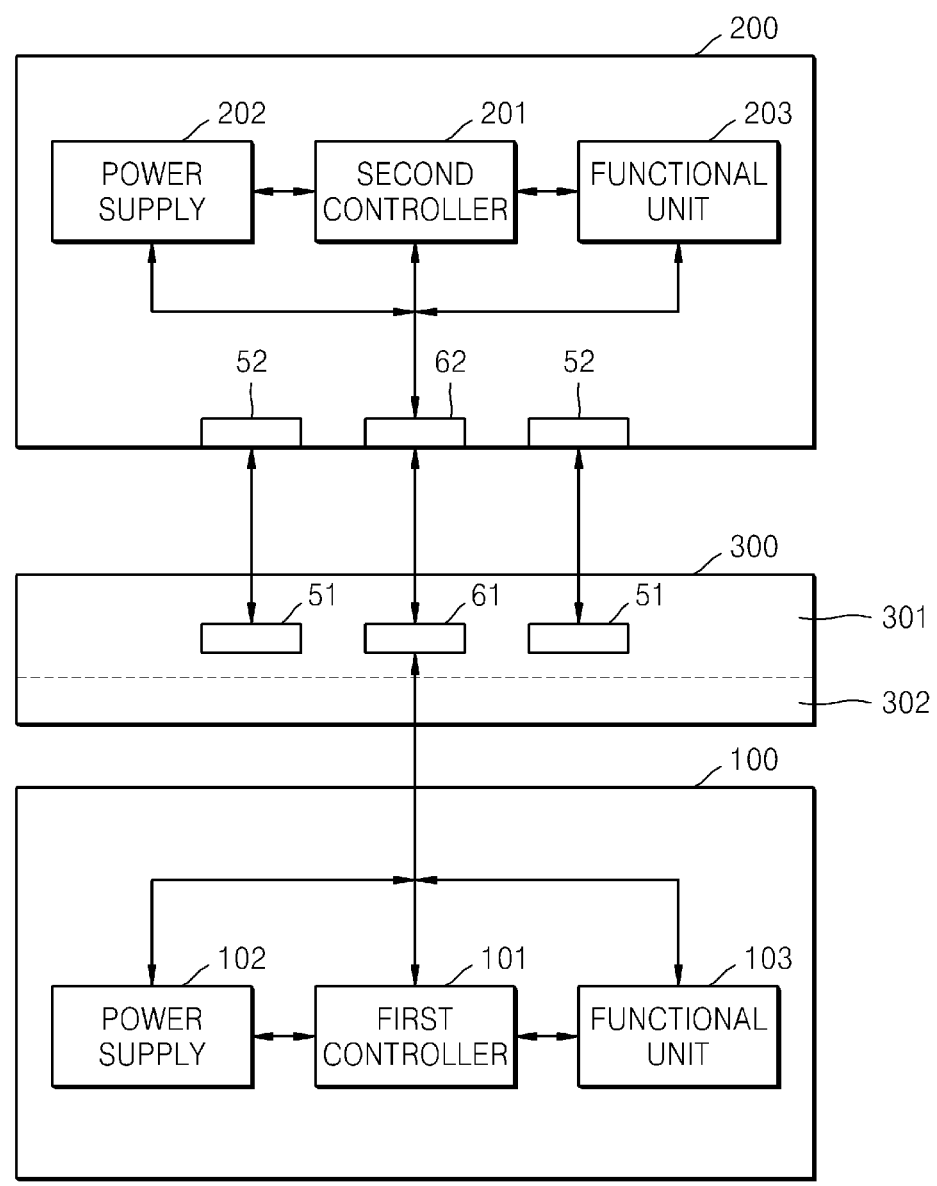
FIG. 17 is a block diagram illustrating a mobile apparatus according to an embodiment of the present general inventive concept.

As illustrated in FIG. 17, a mobile apparatus may include a first body 100, a second body 200, and a rotary adaptor 300. The first body 100 of FIG. 17 is similar to or same as the first body 1 illustrated in FIGS. 1 through 16, the second body of FIG. 17 is similar to or same as the second body 2 illustrated in FIGS. 1 through 16, and the rotary adaptor 300 of FIG. 17 is similar to or same as the rotary adaptor 3 illustrated in FIGS. 1 through 16. Accordingly, detail descriptions thereof will not be repeated but omitted.

Also illustrated in FIG. 17, the first body 100 may include a first controller (one or more processors) 101, a power supply 102 to receive power from an external apparatus, store the power, and supply the received power or the stored power to components of the first body 100 and/or the second body 200, and a functional unit 103 including the keyboard 10 and pointing device 11 of FIG. 1 to input, output, process, transmit and receive a command and data to perform functions of the mobile apparatus.

The rotary adaptor 300 may include an accommodation portion 301 having first magnets 51 and electric contact portion 61 to correspond to the accommodation portion 31 of the rotary adaptor 3. The rotary adaptor 300 may also have an insertion inlet 302 to correspond to the insertion inlet 32 to rotatably couple the second body 200 to the first body 100.

The second body 200 may include a second controller (one or more processors) 201, a power supply 202 to receive power from an external apparatus or the first body 100 through the electric contact portions 61 and 62, store the power, and supply the received power or the stored power to components of the first body 100 and/or the second body 200, and a functional unit 203 including the display unit 20 of FIG. 1 to input, output, process, transmit and receive a command and data to perform functions of the mobile apparatus.

It is possible that the first body 100 may controls the second body 200 and the second body 200 may controls the first body 100, according to a command or data generated and transmitted through the electric contact portions 61 and 62.

Although FIG. 17 illustrates the electric contact portion 62 and the second magnets 52 which can be installed on one side portion of a frame of the second body 200, it is possible that another electric contact portion and another magnets can be installed on the other side portion of the frame of the second body. In this case, the two sets of the electric contact portions 62 can be electrically connected to the second controller 201, the power supply 202, ad/or the functional unit 203 to perform the function of the mobile apparatus. At least one set of electric contact portions 62 is in an active mode to be electrically connected between the first body 100 and the second body 200.

A notebook computer and a tablet computer are described as an example of the mobile apparatus according to the above-described embodiments of the present general inventive concept. However, the present general inventive concept is not limited thereto. For example, the mobile apparatus may be used in a game machine, a communication terminal, a multimedia device to produce image information or image information and audible information, or the like.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:
1. An electronic device, comprising:
a first body including a keyboard;
a second body;
an adaptor that magnetically attaches the first body to the second body, the adaptor being on the first body;
protrusions formed on one of the adaptor and the second body; and
concave portions formed on the other one of the adaptor and the second body so that the protrusions are inserted into the concave portions,
wherein the adaptor includes first magnets and a first electric contact portion, and the second body includes second magnets to face the first magnets, and a second electric contact configured to be in contact with the first electric contact when the first body is attached to the second body via the adaptor.

2. The electronic device of claim 1, wherein the first magnets and the second magnets are disposed at both sides of the first electric contact and both sides of the second electric contact, respectively, and
the first and second electric contacts each include at least one of a power terminal and a signal terminal.

3. The electronic device of claim 2, wherein:
the first magnets comprise a plurality of first magnets;
the second magnets comprise a plurality of second magnets;
each of the plurality of first and second magnets are arranged to have a polarity thereof configured to magnetically attract a facing and/or neighboring one of the plurality of first and second magnets;
the second body has a long side portion and a short side portion; and
the second electric contact and the second magnets are disposed on at least one of the long side portion and the short side portion.

4. The electronic device of claim 2, wherein poles of the first magnets of the adapter and poles of the second magnets of the second body are arranged to create an attractive force therebetween whereby the adapter is magnetically aligned and coupled to the second body so that the first electric contact and the second electric contact are connected to each other when the first magnets and the second magnets are coupled with each other.

5. The electronic device of claim 2, wherein one of the first electric contact and the second electric contact comprise a first terminal unit and a second terminal unit, which have symmetrical terminal arrangements.

6. The electronic device of claim 2, wherein the first electric contact and the second electric contact are connected to each other when the first magnets and the second magnets are coupled with each other.

7. The electronic device of claim 1, wherein at least one of the first magnets and the second magnets is an electromagnet.

8. The electronic device of claim 1, wherein the second body is a display unit or a tablet computer, and
the first body performs at least one function of functions of an auxiliary input device, a power supply device, and a charging station of the tablet computer.

9. The electronic device of claim 8, wherein the first body performs at least one function of functions of an auxiliary input device, a power supply device, and a charging station of the tablet computer.

10. The electronic device of claim 1, wherein:
the first body is a main body of a portable computer; and
the second body comprises a display unit that is connected to the main body and displays an image.

11. The electronic device of claim 1, wherein the other one of the adaptor and the second body includes a support to support the protrusion and to separate the first electric contact and the second electric contact from each other.

12. The electronic device of claim 11, wherein the at least one depression is concave.

13. The electronic device of claim 1, wherein the adaptor includes a pivot axis and the first and second electric contact are rotationally symmetrical along the pivot axis of the adaptor.

14. The electronic device of claim 1, wherein the adaptor includes a pivot axis and the first and second magnets are rotationally symmetrically along the pivot axis of the adaptor.

15. The electronic device of claim 1, wherein the adaptor further includes a third magnet disposed adjacent at least one of the first magnets, and
wherein the third magnet has a same polarity as the second magnets.

16. The electronic device of claim 15, wherein a magnetic repulsive force between the third magnet and the second magnets cause the second body to move such that the first magnets and the second magnets become aligned with each other.

17. The electronic device of claim 1, wherein the second body further includes a third magnet disposed adjacent at least one of the second magnets, and
wherein the third magnet has a same polarity as the first magnets.

18. The electronic device of claim 17, wherein a magnetic repulsive force between the third magnet and the first magnets cause the second body to move such that the first magnets and the second magnets become aligned with each other.

19. The electronic device apparatus of claim 1, wherein the first magnets and the second magnets are symmetrically arranged with respect to the first electric contact and the second electric contact, respectively.

20. The electronic device of claim 1, wherein the second body is a tablet computer, the first body further includes a pointing interface and the first body is an input device including the keyboard and the pointing interface for the tablet computer.

21. The electronic device of claim 1, wherein the first, second and third magnets are configured to magnetically guide the first body into electrical contact alignment with the second body using alternating magnetic poles.

22. The electronic device of claim 1, wherein the first electric contact includes a plurality of electric contacts and the second electric contact includes a plurality of electric contacts and the first magnets and second magnets are symmetrically arranged about the first and second electric contacts, respectively.

23. The electronic device of claim 1, wherein the first magnets and the second magnets are symmetrically arranged with respect to the first electric contact portion and the second electric contact portion, respectively, enabling the first body to reversely attach to the second body.

24. The electronic device of claim 1, wherein the first electric contact portion includes a plurality of first electric contacts and the second electric contact portion includes a plurality of second electric contacts, and the first electric contacts are symmetrically arranged with respect to a midpoint therebetween and the second electric contacts are symmetrically arranged with respect to a midpoint therebetween, enabling the first and second electric contacts to reversely connect to each other when the first body is reversely and magnetically attached to the second body.

25. An electronic apparatus, comprising;
a first body having a first frame with a keyboard, and having an adaptor coupled to the frame, the adaptor having one or more first magnets; and
a second body having a display screen, and having a second frame with a first surface having an opening to expose the display screen, a second surface disposed opposite to the first surface, and a side portion disposed between the first and second surfaces and having one or more second magnets disposed in the side portion to correspond to the one or more first magnets of the adaptor of the first body,
wherein the adaptor magnetically attaches the first body to the second body,
one of the adaptor and the second body includes at least one protrusion,
the other one of the adaptor and the second body includes at least one depression corresponding to the at least one protrusion and
the at least one protrusion is inserted into the corresponding depression when the first magnets and the second magnets are coupled with each other so that the first electric contact and the second electric contact are in contact with each other.

26. An electronic apparatus, comprising:
a first body including a keyboard;
a second body; and
an adaptor to put the first body and second body together, the adaptor being on the first body and the second body being movable relative to the first body, wherein one of the adaptor and the second body includes magnets and the other one of the adaptor having a material attracted by an attractive force of the magnets to magnetically attach the second body to the first body via the adaptor,
one of the adaptor and the second body includes protrusions and the other one of the adaptor and the second body includes receiving portions that correspond to the protrusions and the protrusions are configured to be inserted into the receiving portions when the second body and the input device are magnetically attached to each other,
the adaptor includes a first electric contact, and
the second body includes a second electric contact configured to be in contact with the first electric contact when the first body is magnetically attached to the second body via the adaptor.

27. The electronic device apparatus of claim 26,
wherein the protrusions and the receiving portions are symmetrically arranged with respect to the first electric contact and the second electric contact, respectively.

28. The electronic device apparatus of claim 27, further comprising:
  supports disposed on the other one of the adaptor and the second body to support the protrusions and to separate the first electric contact and the second electric contact from each other when the second body is attached to the first body via the adaptor and is deviated from the first body.

29. The electronic device apparatus of claim 26,
  wherein the receiving portions are concave and
  the protrusions and the concave portions are symmetrically arranged with respect to the first electric contact and the second electric contact portion, respectively.

30. The electronic apparatus of claim 26, wherein the first body further includes a pointing interface.

31. An electronic device, comprising:
  a tablet computer;
  an input device for the tablet computer including an adaptor to magnetically attach the input device to the tablet computer,
  wherein the adaptor includes a first set of electric contacts and first and second sets of magnets arranged on opposite sides of the first set of electric contacts, respectively,
  wherein the tablet computer includes a second set of electric contacts which corresponds to the first set of electric contacts and third and fourth sets of magnets arranged on opposite sides of the second set of electric contacts, respectively, and correspond to the first and second sets of magnets, respectively,
  wherein when the input device and the tablet computer are magnetically attached to each other by attractive forces of the first and third sets of magnets and the second and fourth sets of magnets, the first and second sets of electric contacts are in electrical contact with each other, and
  wherein one of the adaptor and the tablet computer includes protrusions and the other one of the adaptor and the tablet computer includes receiving portions and the protrusions are configured to be inserted into the receiving portions when the tablet computer and the input device are magnetically attached to each other..

32. The electronic device of claim 31, wherein the first and second sets of magnets are arranged symmetrically about a midpoint therebetween, and the third and fourth sets of magnets are arranged symmetrically about a midpoint therebetween, enabling the input device to reversely attach to the tablet computer.

33. The electronic device of claim 32, wherein the first set of electric contacts is arranged symmetrically about a midpoint therebetween, and the second set of electric contacts is arranged symmetrically about a midpoint therebetween, enabling the first and second sets of electric contacts to reversely connect to each other when the input device is reversely and magnetically attached to the tablet computer.

34. The electronic device of claim 31, wherein the first set of electric contacts is arranged symmetrically about a midpoint therebetween, and the second set of electric contacts is arranged symmetrically about a midpoint therebetween, enabling the first and second sets of electric contacts to reversely connect to each other when the input device is reversely and magnetically attached to the tablet computer.

35. The electronic device of claim 31, wherein the first and second sets of magnets include a plurality of magnets with alternating poles, respectively, and the third and fourth sets of magnets include a plurality of magnets with opposite poles to the alternating poles of the first and second sets of magnets, and wherein magnetic forces of the first, second, third and fourth sets of magnets guide the first and second electric contacts into electrical contact alignment and the input device and the tablet computer electrically interact with each other via the first and second electric contacts.

36. The electronic device of claim 35, wherein the first set of magnets have three magnets having one of north, south and north pole arrangement and south, north and south arrangement, and the third set of magnets have three magnets having a pole arrangement opposite to the pole arrangement of first set of magnets.

37. The electronic device of claim 31, wherein the first set of electric contacts and the first and second sets of magnets are arranged in a first line, and the second set of electric contacts and the third and fourth sets of magnets are arranged in a second line, and the first and second lines are parallel to each other when the tablet computer and the input device are magnetically attached to each other.

38. The electronic device of 31, wherein the protrusions and the receiving portions are symmetrically arranged about a midpoint of the first and second sets of electric contacts, respectively.

* * * * *

UNITED STATES PATENT AND TRADEMARK OFFICE
CERTIFICATE OF CORRECTION

| | | |
|---|---|---|
| PATENT NO. | : 9,167,711 B2 | Page 1 of 1 |
| APPLICATION NO. | : 13/681679 | |
| DATED | : October 20, 2015 | |
| INVENTOR(S) | : Seung-Won Lee | |

It is certified that error appears in the above-identified patent and that said Letters Patent is hereby corrected as shown below:

IN THE CLAIMS

Claim 31, Column 17, Line 41

Delete "other.." and insert --other--, therefor.

Claim 38, Column 18, Line 40

Delete "31," and insert --claim 31,--, therefor.

Signed and Sealed this
Second Day of February, 2016

Michelle K. Lee
*Director of the United States Patent and Trademark Office*